(12) United States Patent
Seong

(10) Patent No.: US 9,509,262 B2
(45) Date of Patent: Nov. 29, 2016

(54) CONCURRENT MULTI-BAND RADIO FREQUENCY AMPLIFYING CIRCUIT

(71) Applicant: SAMSUNG ELECTRO-MECHANICS CO., LTD., Suwon-Si, Gyeonggi-Do (KR)

(72) Inventor: Nack Gyun Seong, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 19 days.

(21) Appl. No.: 14/486,555

(22) Filed: Sep. 15, 2014

(65) Prior Publication Data

US 2015/0207474 A1   Jul. 23, 2015

(30) Foreign Application Priority Data

Jan. 22, 2014 (KR) .................. 10-2014-0007880

(51) Int. Cl.
  *H03F 3/04* (2006.01)
  *H03F 3/193* (2006.01)
  *H03F 1/56* (2006.01)
  *H03F 3/21* (2006.01)

(52) U.S. Cl.
  CPC ............. *H03F 3/193* (2013.01); *H03F 1/565* (2013.01); *H03F 3/211* (2013.01); *H03F 2200/111* (2013.01); *H03F 2200/222* (2013.01); *H03F 2200/225* (2013.01); *H03F 2200/387* (2013.01); *H03F 2200/39* (2013.01); *H03F 2200/391* (2013.01)

(58) Field of Classification Search
  CPC ....................................................... H03F 1/22

USPC ................................ 330/311, 283, 295, 302
See application file for complete search history.

(56) References Cited

U.S. PATENT DOCUMENTS

| 7,622,989 B2 | 11/2009 | Tzeng et al. |
| 7,689,187 B2 | 3/2010 | Galan |
| 8,018,288 B2 * | 9/2011 | Duster .................. H03F 1/0255 330/253 |
| 2010/0127783 A1 | 5/2010 | Wolf |

FOREIGN PATENT DOCUMENTS

| KR | 10-2009-0056789 A | 6/2009 |
| KR | 10-2010-0014861 A | 2/2010 |
| WO | 2005104351 A2 | 11/2005 |

* cited by examiner

*Primary Examiner* — Khanh V Nguyen
*Assistant Examiner* — Khiem Nguyen
(74) *Attorney, Agent, or Firm* — NSIP Law

(57) ABSTRACT

A concurrent multi-band RF amplifying circuit may include: an input impedance matching unit performing impedance matching on each of first and second band signals included in an input signal input through one input terminal; an input amplifying unit including first and second band amplifying units each amplifying the first and second band signals input through the input impedance matching unit; a common ground circuit unit connected between a first common node commonly connected to the first and second band amplifying unit and a ground and including an impedance device for matching of an input impedance; and an output amplifying unit amplifying signals from each of the first and second band amplifying units.

18 Claims, 10 Drawing Sheets

CONCURRENT MULTI-BAND RADIO FREQUENCY AMPLIFYING CIRCUIT

CROSS-REFERENCE TO RELATED APPLICATION

This application claims the benefit of Korean Patent Application No. 10-2014-0007880 filed on Jan. 22, 2014, with the Korean Intellectual Property Office, the disclosure of which is incorporated herein by reference.

BACKGROUND

The present disclosure relates to a concurrent multi-band radio frequency (RF) amplifying circuit.

Generally, in accordance with an increase in a demand for various wireless communications standards as well as the implementation thereof, demand for a multi-band transceiver able to simultaneously process signals within several bands in a single portable device has increased.

In accordance with a general increase in the application of wireless communications schemes, demand for a transceiver able to simultaneously process multi-band and multi-standard signals has increased. For example, in the case of a wireless local area network (WLAN), various standards such as IEEE 802.11x (here, x is a, b, g, n, ac, and the like) have been introduced in an effort to improve transmission rates.

Recently, in WLAN communications, a real time simultaneous dual band (RSDB) WLAN technology in which a 2.4 GHz (2.4 to 2.48 GHz) band and a 5 GHz (5.150 to 5.825 GHz) band are used simultaneously has been supported.

Therefore, in the case of WLAN communications, there are devices that simultaneously use a 2.4 GHz band and a 5 GHz band, and in the case of a cellular communications network band such as a domestic long term evolution (LTE) network, or the like, 800 MHz, 900 MHz, 1800 MHz, and 2.1 GHz bands have been used simultaneously.

Therefore, a device that may transmit and receive multi-band signals in a single radio frequency (RF) front-end module has been required. Particularly, a technology of processing several frequencies using one low noise amplifier (LNA) positioned at a front end of a receiver has been required.

Therefore, a technology of a concurrent dual-band LNA that may simultaneously process signals of two different bands in one receiver has been required, and a compact size design technology that may design the LAN at a low cost has been required.

An existing dual-band LNA includes an amplifying circuit for 2.4 GHz and an amplifying circuit for 5 GHz, and any one of the amplifying circuit for 2.4 GHz and the amplifying circuit for 5 GHz is operated.

Therefore, the amplifying circuit for 2.4 GHz may be operated in order to process a signal of a 2.4 GHz band and the amplifying circuit for 5 GHz may be operated in order to process a signal of a 5 GHz band. However, since the existing dual-band LNA may not simultaneously process signals of two bands, it does not support a concurrent dual band that may simultaneously process signals of two bands.

The following Related Art Document (Patent Document 1), which relates to a multi-band low noise amplifier, discloses a technology that may separately process two bands in a time division scheme, or the like, but does not disclosure a concurrent dual-band technology that may simultaneously process two bands.

RELATED ART DOCUMENT (Patent Document 1) Korean Patent Laid-Open Publication No. 2009-0056789

SUMMARY

An exemplary embodiment in the present disclosure may provide a concurrent multi-band radio frequency (RF) amplifying circuit having a concurrent multi-band structure capable of simultaneously processing at least two bands.

According to an exemplary embodiment in the present disclosure, a concurrent multi-band RF amplifying circuit may include: an input impedance matching unit performing impedance matching on each of first and second band signals included in an input signal input through one input terminal; an input amplifying unit including first and second band amplifying units each amplifying the first and second band signals input through the input impedance matching unit; a common ground circuit unit connected between a first common node commonly connected to the first and second band amplifying unit and a ground and including an impedance device for matching of an input impedance; and an output amplifying unit amplifying signals from each of the first and second band amplifying units.

According to an exemplary embodiment in the present disclosure, a concurrent multi-band RF amplifying circuit may include: an input impedance matching unit performing impedance matching on each of first and second band signals included in an input signal input through one input terminal; an input amplifying unit including first and second band amplifying units each amplifying the first and second band signals input through the input impedance matching unit; a common ground circuit unit connected between a first common node commonly connected to the first and second band amplifying unit and a ground and including an impedance device for matching of an input impedance; an output amplifying unit connected to each of the first and second band amplifying units in a cascode structure and amplifying signals from each of the first and second band amplifying units; and an output impedance matching unit performing matching of an output impedance of the output amplifying unit.

The input impedance matching unit may include: a first impedance device for matching of an input impedance of the first band amplifying unit; and a second impedance device for matching of an input impedance of the second band amplifying unit.

Each of the first and second band amplifying units may include a common source amplifier, and the output amplifying unit may include a common gate amplifier.

The output amplifying unit may include a metal oxide semiconductor (MOS) transistor having a drain and a gate connected to a terminal of a power supply voltage and a source receiving a signal from the input amplifying unit.

The first band amplifying unit may include an MOS transistor having a drain connected to the output amplifying unit, a gate connected to the input impedance matching unit, and a source connected to the common ground circuit unit.

The second band amplifying unit may include an MOS transistor having a drain connected to the output amplifying unit, a gate connected to the input impedance matching unit, and a source connected to the common ground circuit unit.

The impedance device of the common ground circuit unit may be a common inductor providing an inductance for matching of the input impedance together with the input impedance matching unit.

According to an exemplary embodiment in the present disclosure, a concurrent multi-band RF amplifying circuit may include: an input impedance matching unit performing impedance matching on each of first to N-th band signals included in an input signal input through one input terminal; an input amplifying unit including first to N-th band amplifying units each amplifying the first to N-th band signals input through the input impedance matching unit; a common ground circuit unit connected between a first common node commonly connected to the first to N-th band amplifying unit and a ground and including an impedance device for matching of an input impedance; an output amplifying unit connected to each of the first to N-th band amplifying units in a cascode structure and amplifying signals from each of the first to N-th band amplifying units; and an output impedance matching unit performing matching of an output impedance of the output amplifying unit.

The input impedance matching unit may include first to N-th impedance devices for matching of input impedances of each of the first to N-th band amplifying units.

Each of the first to N-th band amplifying units may include a common source amplifier, and the output amplifying unit may include a common gate amplifier.

The output amplifying unit may include an MOS transistor having a drain and a gate connected to a terminal of a power supply voltage and a source receiving a signal from the input amplifying unit, the first band amplifying unit may include an MOS transistor having a drain connected to the output amplifying unit, a gate connected to the input impedance matching unit, and a source connected to the common ground circuit unit, and the N-th band amplifying unit may include an MOS transistor having a drain connected to the output amplifying unit, a gate connected to the input impedance matching unit, and a source connected to the common ground circuit unit.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
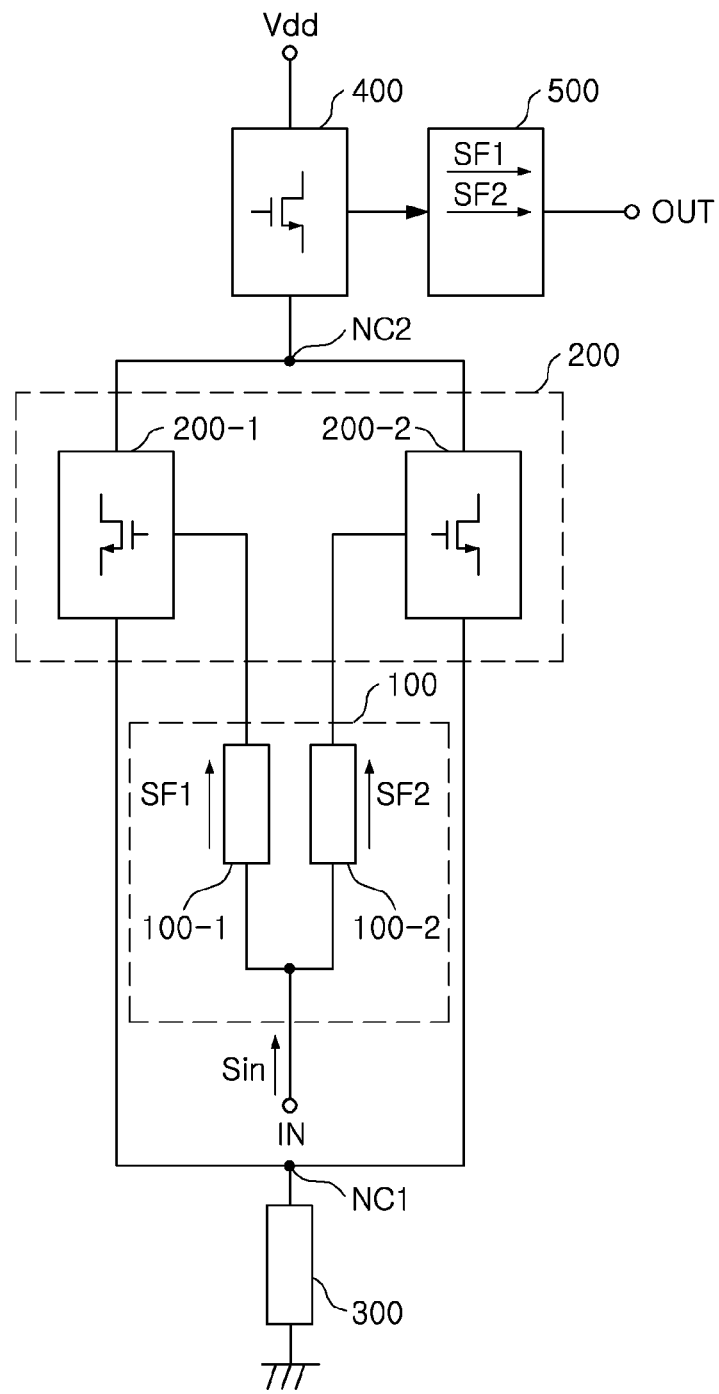
FIG. 1 is a first block diagram illustrating a configuration of a concurrent multi-band radio frequency (RF) amplifying circuit according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

FIG. 1 is a first block diagram illustrating a configuration of a concurrent multi-band radio frequency (RF) amplifying circuit according to an exemplary embodiment of the present disclosure.

Referring to FIG. 1, the concurrent multi-band RF amplifying circuit according to an exemplary embodiment of the present disclosure may include an input impedance matching unit 100, an input amplifying unit 200 including first and second band amplifying units 200-1 and 200-2, a common ground circuit unit 300, and an output amplifying unit 400.

In addition, the concurrent multi-band RF amplifying circuit may further include an output impedance matching unit 500.

The input impedance matching unit 100 may perform impedance matching on each of first and second band signals SF1 and SF2 included in an input signal Sin input through one input terminal IN.

As an example, the input impedance matching unit 100 may include a first impedance device 100-1 for matching of an input impedance of the first band amplifying unit 200-1 and a second impedance device 100-2 for matching of an input impedance of the second band amplifying unit 200-2.

Here, the first impedance device 100-1 may be formed of an inductor device having an inductance for performing matching of an input impedance on the first band signal SF1 input to the first band amplifying unit 200-1.

In addition, the second impedance device 100-2 may be formed of an inductor device having an inductance for performing matching of an input impedance on the second band signal SF2 input to the second band amplifying unit 200-2.

The input amplifying unit 200 may include the first and second band amplifying units 200-1 and 200-2 each amplifying the first and second band signals SF1 and SF2 input through the input impedance matching unit 100.

As an example, each of the first and second band amplifying units 200-1 and 200-2 may include a common source (CS) amplifier.

The common ground circuit unit 300 may be connected between a first common node NC1 commonly connected to the first and second band amplifying unit 200-1 and 200-2 and a ground and may include an impedance device for matching of an input impedance.

The output amplifying unit 400 may amplify signals from each of the first and second band amplifying units 200-1 and 200-2.

As an example, the output amplifying unit 400 may include a common gate (CG) amplifier. Here, the output amplifying unit 400 may be connected to each of the first and second band amplifying units 200-1 and 200-2 in a cascode structure.

Here, the first band signal SF1 may be amplified through each of the first band amplifying unit 200-1 and the output amplifying unit 400, and the second band signal SF2 may be amplified through each of the second band amplifying unit 200-2 and the output amplifying unit 400. Therefore, each of the first and second band signals SF1 and SF2 may be two-stage-amplified by an amplifying circuit having a cascode structure, such that a gain relatively higher as compared with one-stage amplification may be secured.

Meanwhile, a current by a power supply voltage Vdd may flow through the output amplifying unit 400 and be then branched through each of the first and second band amplifying units 200-1 and 200-2. Then, the branched currents may be joined together through the common ground circuit unit 300 and then flow to the ground. Since a single current path is generally formed by the cascode structure as described above, current consumption may be decreased.

In addition, the output impedance matching unit 500 may perform matching of an output impedance of the output amplifying unit 400.

Figure 2:
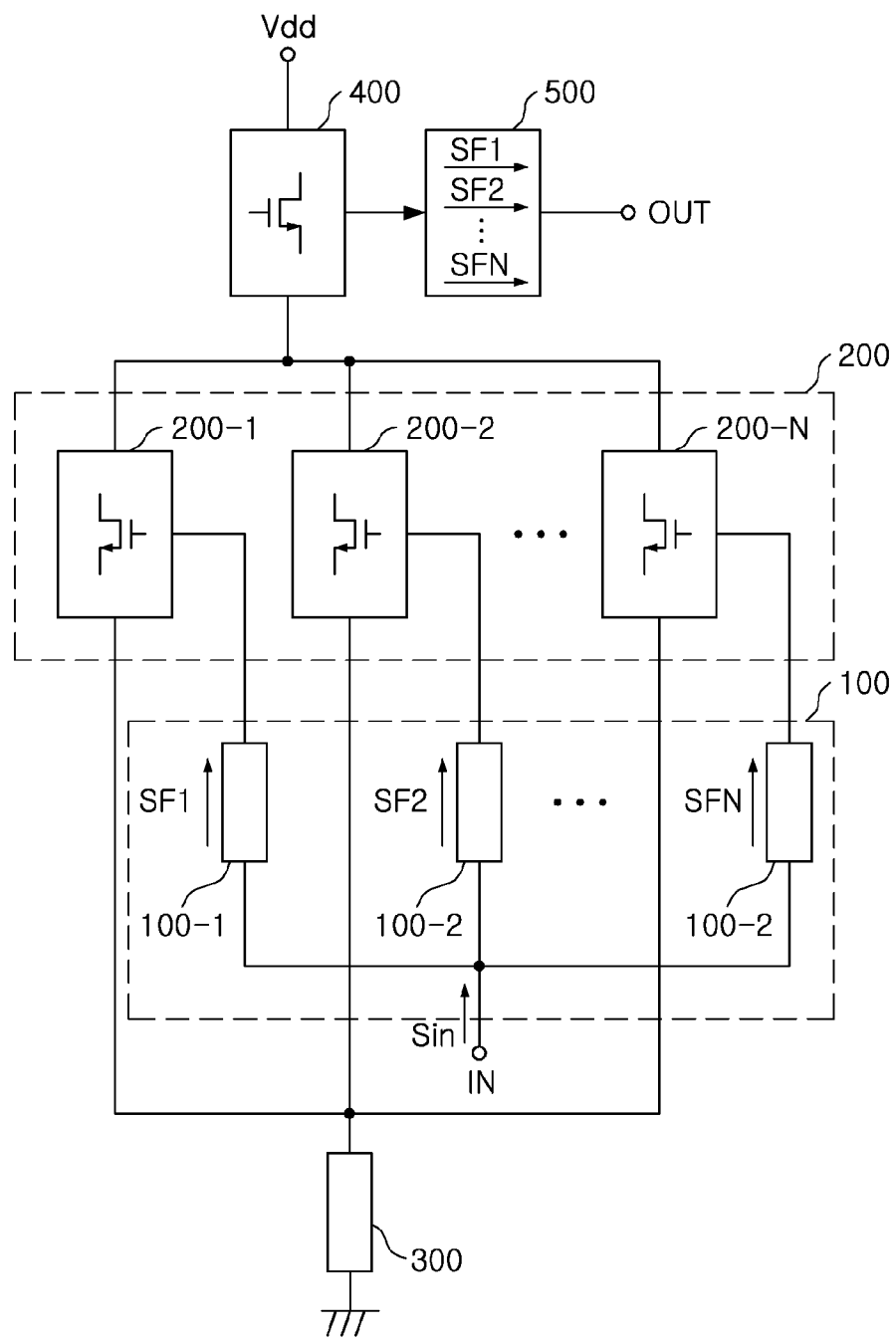
FIG. 2 is a second block diagram illustrating a configuration of a concurrent multi-band RF amplifying circuit according to an exemplary embodiment of the present disclosure.

FIG. 2 is a second block diagram illustrating a configuration of a concurrent multi-band RF amplifying circuit according to an exemplary embodiment of the present disclosure.

Referring to FIG. 2, the concurrent multi-band RF amplifying circuit according to an exemplary embodiment of the present disclosure may include an input impedance matching unit 100, an input amplifying unit 200 including first to N-th band amplifying units 200-1 and 200-N, a common ground circuit unit 300, and an output amplifying unit 400.

In addition, the concurrent multi-band RF amplifying circuit may further include an output impedance matching unit 500.

The input impedance matching unit 100 may perform impedance matching on each of first to N-th band signals SF1 to SFN included in an input signal Sin input through one input terminal IN.

As an example, the input impedance matching unit 100 may include first to N-th impedance devices 100-1 to 100-N for matching of input impedances of each of the first to N-th band amplifying units 200-1 to 200-N.

Here, the first impedance device 100-1 may be formed of an inductor device having an inductance for performing matching of an input impedance on the first band signal SF1 input to the first band amplifying unit 200-1.

In addition, the N-th impedance device 100-N may be formed of an inductor device having an inductance for performing matching of an input impedance on the N-th band signal SFN input to the N-th band amplifying unit 200-N.

The input amplifying unit 200 may include the first to N-th band amplifying units 200-1 to 200-N each amplifying the first to N-th band signals SF1 to SFN input through the input impedance matching unit 100.

As an example, each of the first to N-th band amplifying units 200-1 to 200-N may include a CS amplifier.

The common ground circuit unit 300 may be connected between a first common node NC1 commonly connected to the first to N-th band amplifying unit 200-1 to 200-N and a ground and may include an impedance device for matching of an input impedance.

The output amplifying unit 400 may amplify signals from each of the first to N-th band amplifying units 200-1 to 200-N.

As an example, the output amplifier 400 may include a common gate (CG) amplifier. Here, the output amplifying unit 400 may be connected to each of the first to N-th band amplifying units 200-1 to 200-N in a cascode structure.

Here, the first band signal SF1 may be amplified through each of the first band amplifying unit 200-1 and the output amplifying unit 400, and the N-th band signal SFN may be amplified through each of the N-th band amplifying unit 200-N and the output amplifying unit 400. Therefore, each of the first to N-th band signals SF1 to SFN may be two-stage-amplified by an amplifying circuit having a cascode structure, such that a gain relatively higher as compared with one-stage amplification may be secured.

Meanwhile, a current by a power supply voltage Vdd may flow through the output amplifying unit 400 and be then branched through each of the first to N-th band amplifying units 200-1 to 200-N. Then, the branched currents may be joined together through the common ground circuit unit 300 and then flow to the ground. Since a single current path is generally formed by the cascode structure as described above, current consumption may be decreased.

In addition, the output impedance matching unit 500 may perform matching of an output impedance of the output amplifying unit 400.

Figure 3:
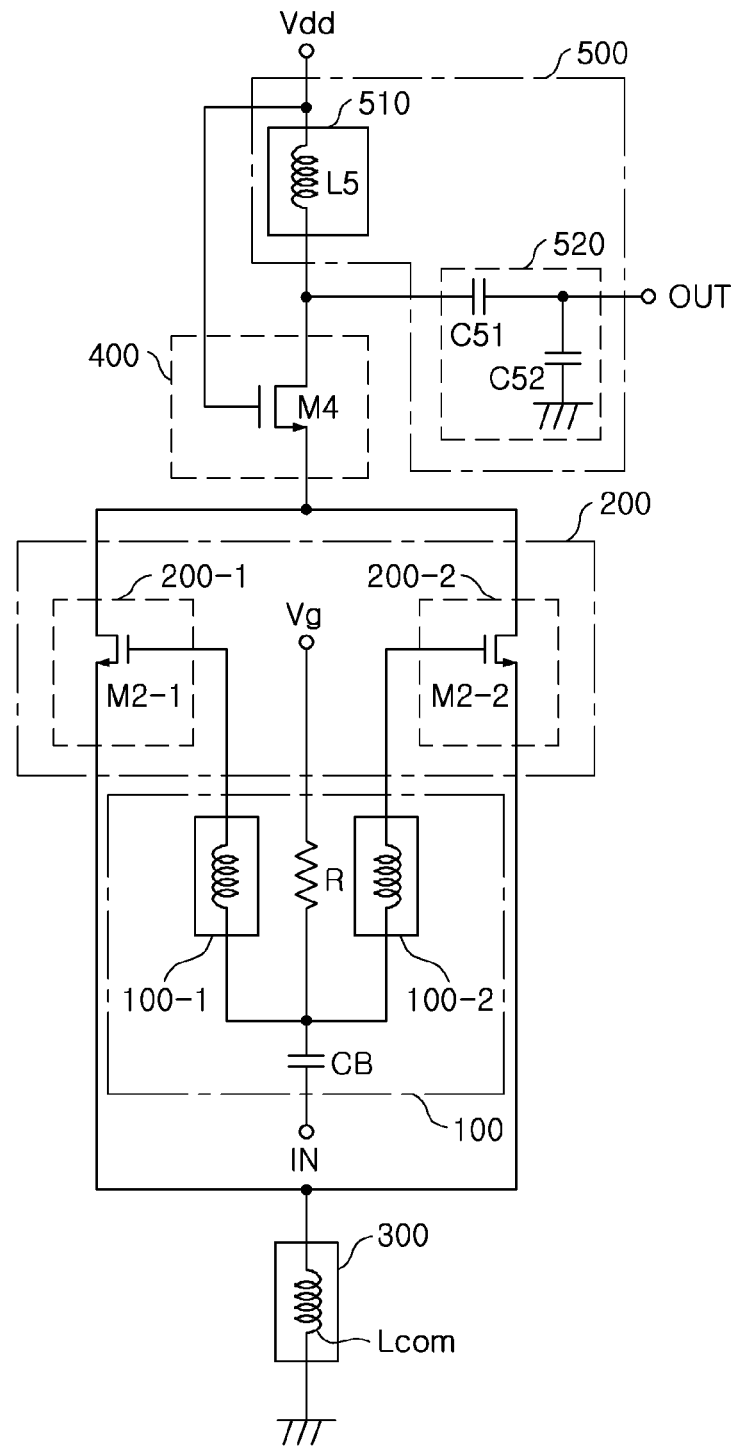
FIG. 3 is a diagram illustrating an implementation of the concurrent multi-band RF amplifying circuit of FIG. 1.

FIG. 3 is a diagram illustrating an implementation of the concurrent multi-band RF amplifying circuit of FIG. 1.

Referring to FIGS. 1 and 3, a gate voltage Vg may be supplied to a connection node between the first impedance device 100-1 and the second impedance device 100-2 through a resistor R. Therefore, the gate voltage Vg may be supplied as a bias voltage to each of gates of the first and second band amplifying units 200-1 and 200-2 through each of the first and second impedance devices 100-1 and 100-2.

In this configuration, the input terminal IN may be connected to the connection node between the first impedance device 100-1 and the second impedance device 100-2 through a direct current (DC) blocking capacitor CB.

Referring to FIGS. 1 and 3, the first band amplifying unit 200-1 may include a metal oxide semiconductor (MOS) transistor M2-1 having a drain connected to the output amplifying unit 400, a gate connected to the first impedance device 100-1 of the input impedance matching unit 100, and a source connected to the common ground circuit unit 300.

The MSO transistor M2-1 may amplify the first band signal SF1 input through the first impedance device 100-1 of the input impedance matching unit 100 and provide the amplified signal to the output amplifying unit 400.

The second band amplifying unit 200-2 may include an MOS transistor M2-2 having a drain connected to the output amplifying unit 400, a gate connected to the second impedance device 100-2 of the input impedance matching unit 100, and a source connected to the common ground circuit unit 300.

The MSO transistor M2-2 may amplify the second band signal SF2 input through the second impedance device 100-2 of the input impedance matching unit 100 and provide the amplified signal to the output amplifying unit 400.

The output amplifying unit 400 may include an MOS transistor M4 having a drain and agate connected to a terminal of the power supply voltage Vdd and a source receiving a signal from the input amplifying unit 200.

The MOS transistor M4 may amplify the signal from the input amplifying unit 200 and provide the amplified signal to the output impedance matching unit 500.

Here, the signal from the input amplifying unit 200 may be the first band signal SF1 or the second band signal SF2 or may be a signal including the first and second band signals SF1 and SF2.

Meanwhile, the impedance device of the common ground circuit unit 300 may be a common inductor Lcom providing an inductance for matching of the input impedance together with the input impedance matching unit 100.

For example, the common inductor Lcom may be implemented by a fixed inductor or be implemented by a variable inductor capable of adjusting an inductance, if necessary.

In addition, the output impedance matching unit 500 may include an inductance circuit unit 510 and a capacitance circuit unit 520.

The inductance circuit unit 510 may be connected to a line supplying the power supply voltage Vdd of the output amplifying unit 400, and may include at least one inductance device. For example, the inductance circuit unit 510 may include an inductor L5, as shown in FIG. 3. Here, the inductor may serve to suppress an alternating current (AC) component included in the power supply voltage.

The capacitance circuit unit 520 may be connected between the output amplifying unit 400 and one output terminal OUT, and may include at least one capacitance device. For example, the capacitance circuit unit 520 may include two capacitors C51 and C52 connected in series and parallel with a signal line between the output amplifying unit 400 and the output terminal OUT, as shown in FIG. 3. Here, the two capacitors C51 and C52 may serve to pass the first and second band signals SF1 and SF2 to the output terminal OUT therethrough and suppress a DC component.

In addition, the inductor L5 and the two capacitors C51 and C52 may perform impedance matching on each of center frequencies of the first and second band signals SF1 and SF2. Therefore, the first and second band signals SF1 and SF2 may be provided to the output terminal OUT without being lost.

Figure 4:
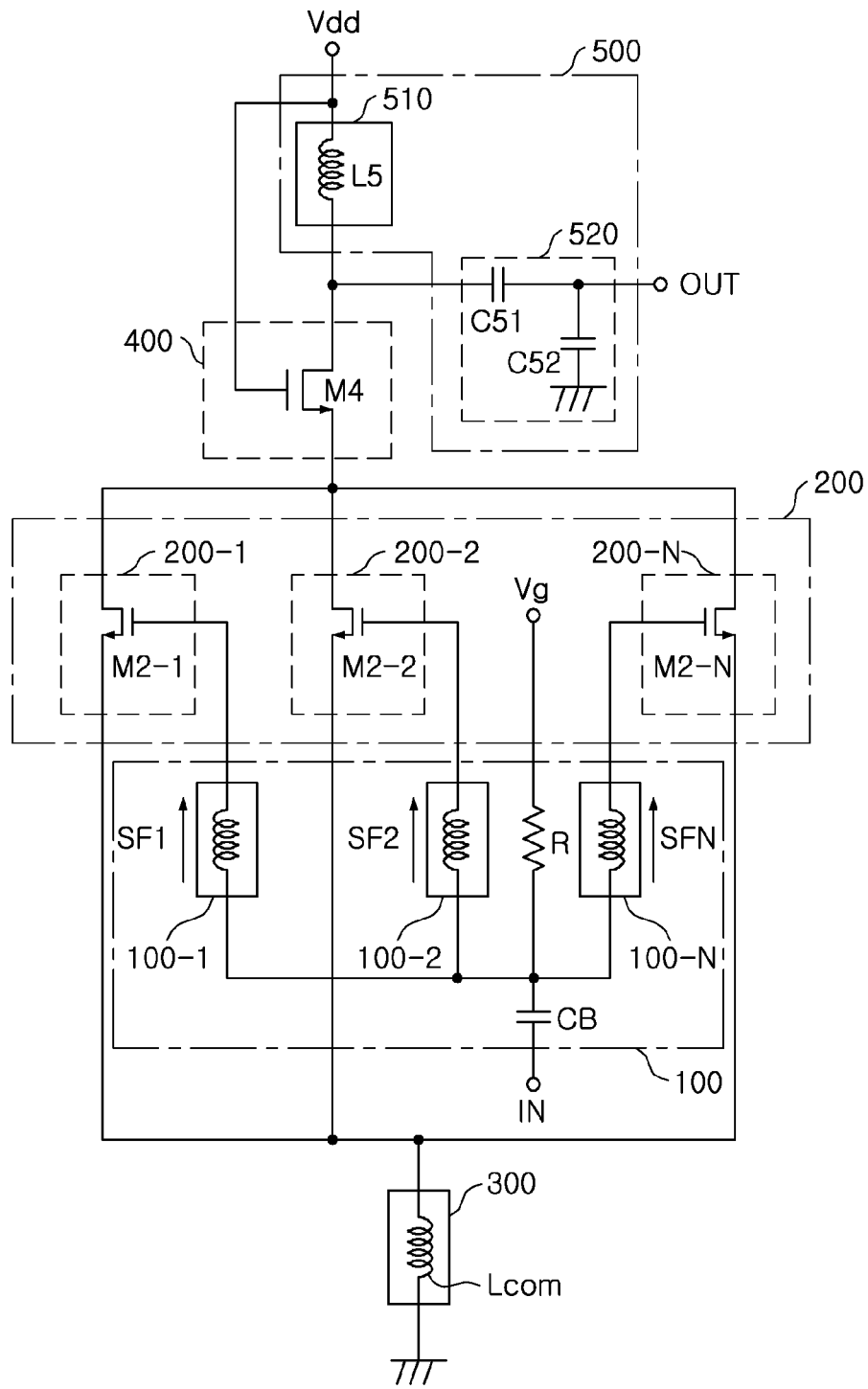
FIG. 4 is a diagram illustrating an implementation of the concurrent multi-band RF amplifying circuit of FIG. 2.

FIG. 4 is a diagram illustrating an implementation of the concurrent multi-band RF amplifying circuit of FIG. 2.

Referring to FIGS. 2 and 4, a gate voltage Vg may be supplied to a connection node among the first impedance device 100-1 to the N-th impedance device 100-N through a resistor R. Therefore, the gate voltage Vg may be supplied as a bias voltage to each of gates of the first to N-th band amplifying units 200-1 to 200-N through each of the first to N-th impedance devices 100-1 to 100-N.

In this configuration, the input terminal IN may be connected to the connection node among the first impedance device 100-1 to the N-th impedance device 100-N through a DC blocking capacitor CB.

A description for the same operations as the operations described with reference to FIGS. 1 through 3 among operations of the impedance matching unit 100, the input amplifying unit 200 including the first to N-th band amplifying units 200-1 to 200-N, the common ground circuit unit 300, the output amplifying unit 400, and the output impedance matching unit 500 shown in FIG. 4 will be omitted in order to avoid an overlapped description.

Referring to FIGS. 2 and 4, the first band amplifying unit 200-1 may include a metal MOS transistor M2-1 having a drain connected to the output amplifying unit 400, a gate connected to the first impedance device 100-1 of the input impedance matching unit 100, and a source connected to the common ground circuit unit 300.

The MOS transistor M2-1 may amplify the first band signal SF1 input through the first impedance device 100-1 of the input impedance matching unit 100 and provide the amplified signal to the output amplifying unit 400.

The N-th band amplifying unit 200-N may include an MOS transistor M2-M having a drain connected to the output amplifying unit 400, a gate connected to the N-th impedance device 100-N of the input impedance matching unit 100, and a source connected to the common ground circuit unit 300.

The MOS transistor M2-N may amplify the N-th band signal SFN input through the N-th impedance device 100-N of the input impedance matching unit 100 and provide the amplified signal to the output amplifying unit 400.

The MOS transistor M4 of the output amplifying unit 400 may amplify the signal from the input amplifying unit 200 and provide the amplified signal to the output impedance matching unit 500, as described above.

Here, the signal from the input amplifying unit 200 may be at least one of the first to N-th band signals SF1 to SFN.

Meanwhile, the impedance device of the common ground circuit unit 300 may be a common inductor providing an inductance for matching of the input impedance together with the input impedance matching unit 100.

Here, the common inductor Lcom of the common ground circuit unit 300 may perform impedance matching on a center frequency of the first band signal SF1 together with the first impedance device 100-1 of the input impedance matching unit 100 and a parasitic capacitance of the MOS transistor M2-1 of the first band amplifying unit 200-1. Therefore, only the first band signal SF1 may be transferred to the first band amplifying unit 200-1 without being lost, and a band signal other than the first band signal SF1 may be suppressed from being transferred to the first band amplifying unit 200-1.

In addition, the common inductor Lcom of the common ground circuit unit 300 may perform impedance matching on a center frequency of the N-th band signal SFN together with the N-th impedance device 100-N of the input impedance matching unit 100 and a parasitic capacitance of the MOS transistor M2-N of the N-th band amplifying unit 200-N. Therefore, only the N-th band signal SFN may be transferred to the N-th band amplifying unit 200-N without being lost, and a band signal other than the N-th band signal SFN may be suppressed from being transferred to the N-th band amplifying unit 200-N.

Figure 5:
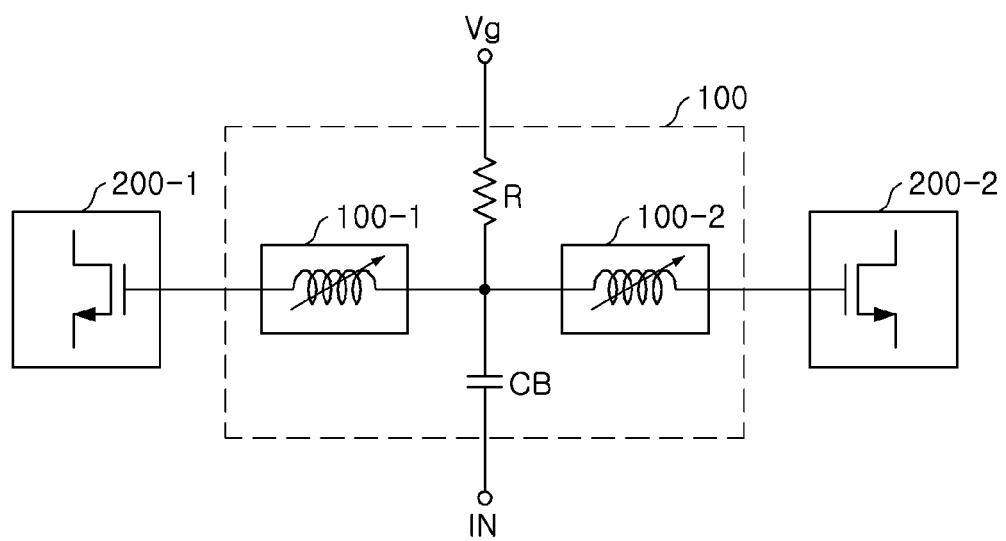
FIG. 5 is a diagram illustrating another implementation of an input impedance matching unit according to an exemplary embodiment of the present disclosure.

FIG. 5 is a diagram illustrating another implementation of an input impedance matching unit according to an exemplary embodiment of the present disclosure.

As shown in FIG. 3, the input impedance matching unit 100 may be implemented by a fixed inductance circuit unit.

Unlike this, as shown in FIG. 5, the input impedance matching unit 100 may be implemented by a variable inductance circuit unit so as to perform optimal matching to a used frequency band of an applied system in consideration of a design, a fixed error, and the like.

First, as shown in FIG. 3, the inductance circuit unit 510 may be implemented by a fixed inductor. Unlike this, as shown in FIG. 6A, the inductance circuit unit 510 may be implemented by at least one variable inductance circuit so as to perform optimal matching to the used frequency band of the applied system.

Figure 6A:
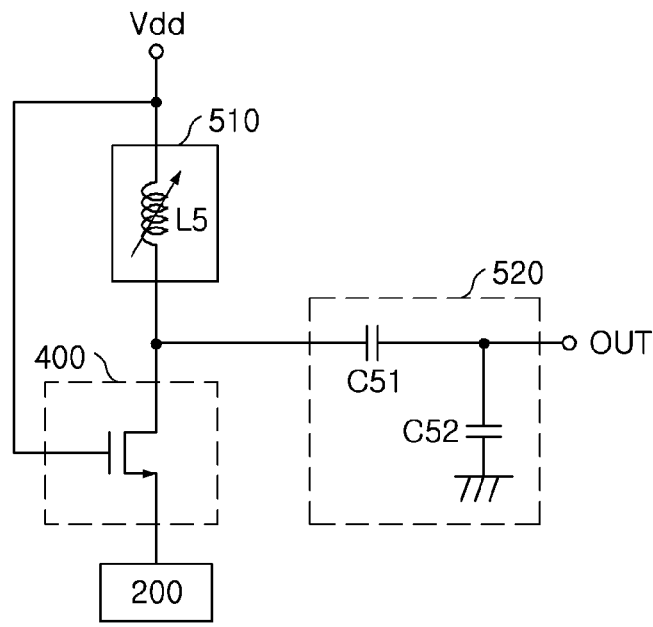
FIGS. 6A and 6B are diagrams illustrating another implementation of an output impedance matching unit according to an exemplary embodiment of the present disclosure.
Figure 6B:
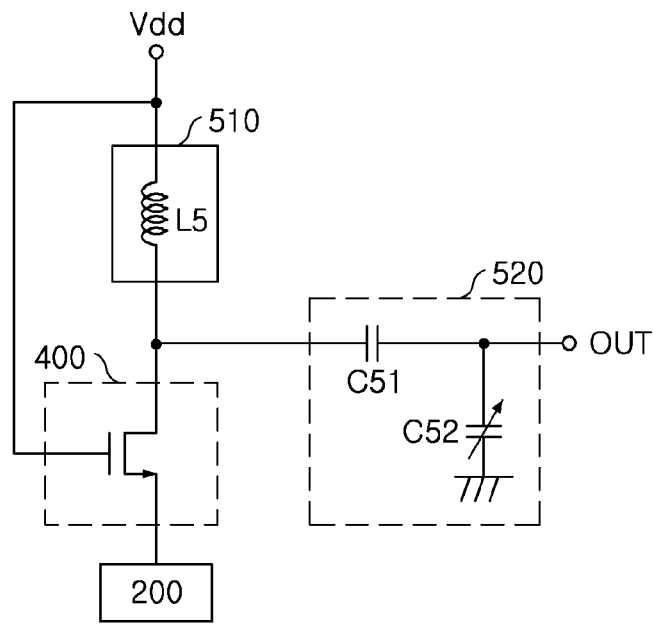

FIGS. 6A and 6B are diagrams illustrating another implementation of an output impedance matching unit according to an exemplary embodiment of the present disclosure.

The output impedance matching unit 500 shown in FIGS. 3, 6A and 6B are provided as an example, and the present disclosure is not limited thereto.

First, as shown in FIG. 3, the inductance circuit unit 510 may be implemented by a fixed inductor. Unlike this, as shown in FIG. 6A, the inductance circuit unit 510 may be implemented by at least one variable inductance circuit so as to perform optimal matching to the used frequency band of the applied system.

In addition, as shown in FIG. 3, the capacitance circuit unit 520 may be implemented by a fixed capacitance circuit. Unlike this, as shown in FIG. 6B, the capacitance circuit unit 520 may be implemented by a variable capacitance circuit in which at least one of the capacitors C51 and C52 included therein may be variable so as to perform optimal matching to the used frequency band of the applied system.

Figure 7:
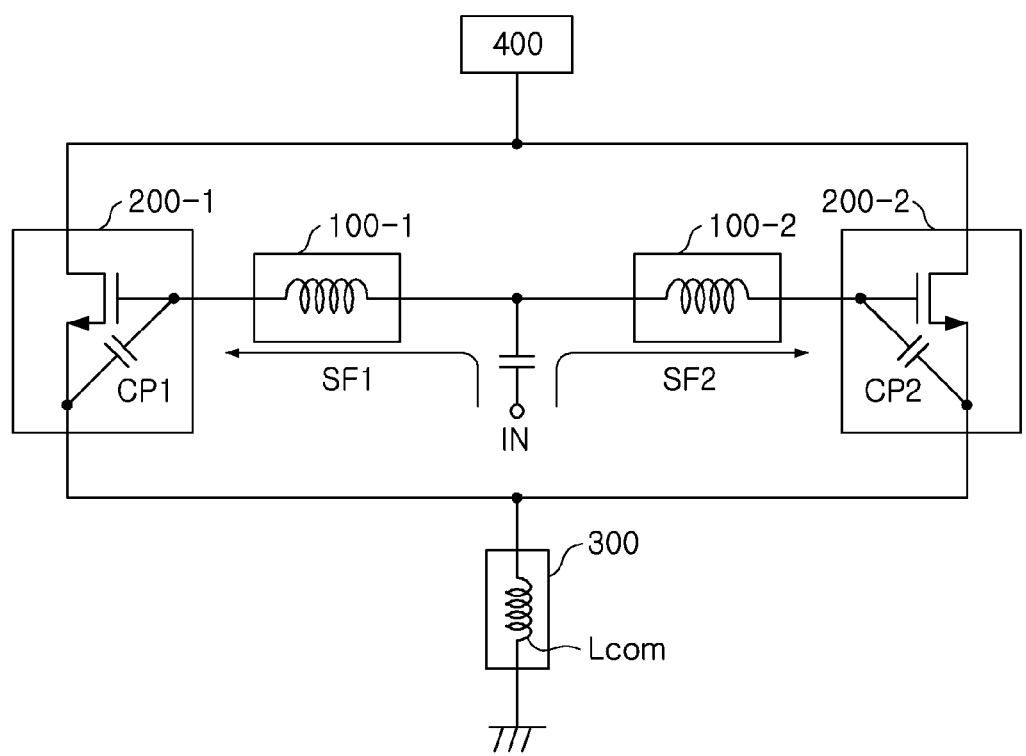
FIG. 7 is a diagram for describing input impedance matching according to an exemplary embodiment of the present disclosure.

FIG. 7 is a diagram for describing input impedance matching according to an exemplary embodiment of the present disclosure.

Referring to FIG. 7, the common inductor Lcom of the common ground circuit unit 300 may perform impedance matching on a center frequency of the first band signal SF1 together with the first impedance device 100-1 of the input impedance matching unit 100 and a parasitic capacitance CP1 of the MOS transistor M2-1 of the first band amplifying unit 200-1.

Therefore, only the first band signal SF1 may be transferred to the first band amplifying unit 200-1 without being lost, and the second band signal SF2 may be suppressed from being transferred to the first band amplifying unit 200-1.

In addition, the common inductor Lcom of the common ground circuit unit 300 may perform impedance matching on a center frequency of the second band signal SF2 together with the second impedance device 100-2 of the input impedance matching unit 100 and a parasitic capacitance CP2 of the MOS transistor M2-2 of the second band amplifying unit 200-2.

Therefore, only the second band signal SF2 may be transferred to the second band amplifying unit 200-2 without being lost, and the first band signal SF1 may be suppressed from being transferred to the second band amplifying unit 200-2.

In the case in which the signal according to an exemplary embodiment of the present disclosure described above includes the first and second band signals SF1 and SF2, which are multi-band signals, the first band signal SF1 may be a signal of a 2.4 GHz band of a wireless LAN (hereinafter, referred to as WiFi), and the second band signal SF2 may be a signal of a 5 GHz band of the WiFi.

Alternatively, in the case in which the signal according to an exemplary embodiment of the present disclosure described above includes the first band signal SF1, the second band signal SF2, and a third band signal, which are multi-band signals, the first band signal SF1 may be a signal of a 800 MHz band of a cellular communications network, the second band signal SF2 may be a signal of a 1800 MHz band of the cellular communications network, and the third band signal may be a signal of a 2100 MHz band of the cellular communications network.

Hereinafter, in FIGS. 8 through 12, an example of the 2.4 GHz band of the WiFi and the 5 GHz band of the WiFi will be described.

Figure 8:
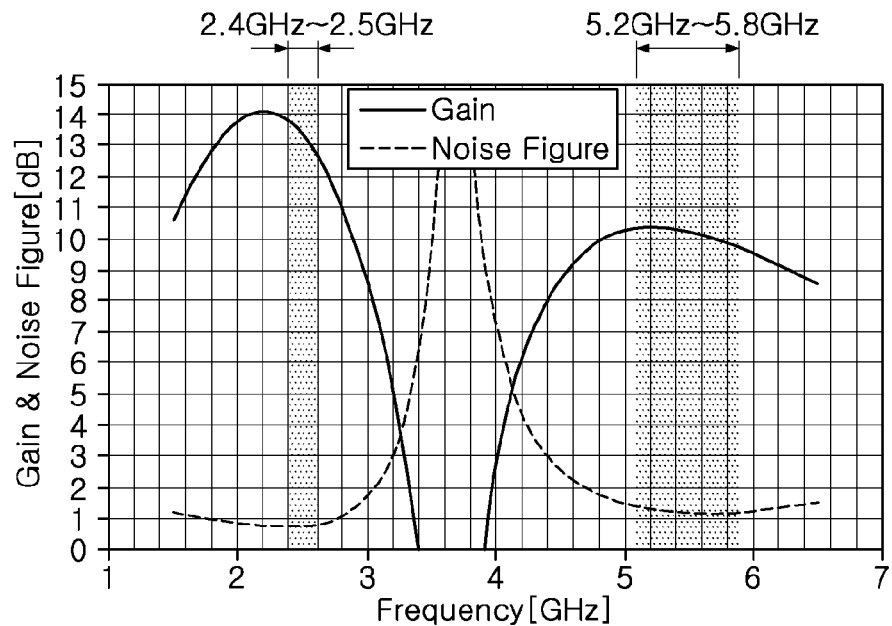
FIG. 8 is a graph illustrating characteristics of a gain and a noise feature according to an exemplary embodiment of the present disclosure.
Figure 9:
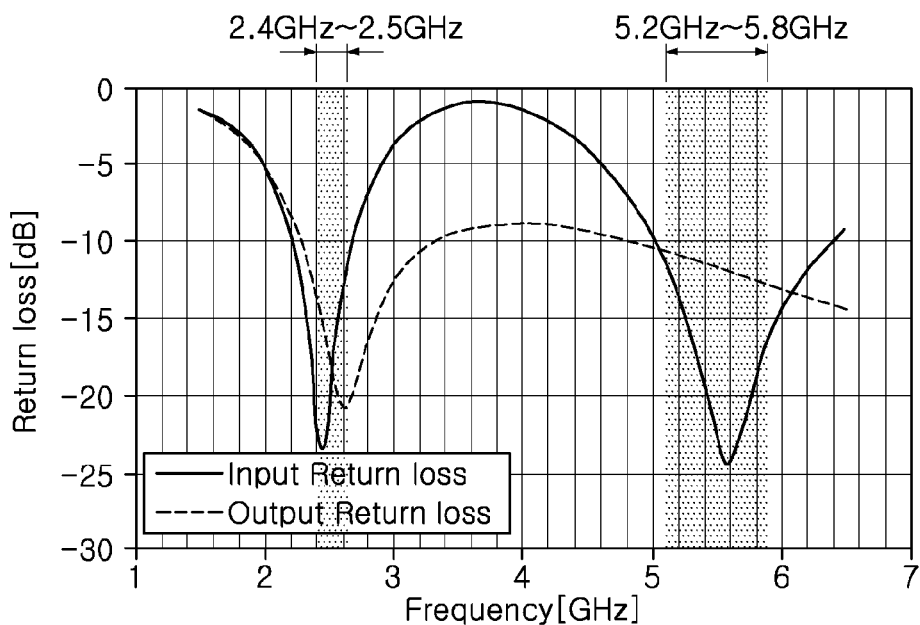
FIG. 9 is a graph illustrating characteristics of input and output return losses according to an exemplary embodiment of the present disclosure.

FIG. 8 is a graph illustrating characteristics of a gain and a noise feature according to an exemplary embodiment of the present disclosure; and FIG. 9 is a graph illustrating characteristics of input and output return losses according to an exemplary embodiment of the present disclosure.

FIGS. 8 and 9 are graphs illustrating simulation results of gains and noise features in first and second bands 2.4 GHz and 5 GHz as an S parameter.

First referring to FIG. 8, a gain in the 2.4 GHz band (2.4 GHz to 2.5 GHz) was 13.4 to 13.8 dB, and a noise feature (NF) in the 2.4 GHz band was about 0.8 dB.

Referring to FIG. 9, input and output return losses in the 2.4 GHz band were 10 dB or more within a bandwidth. An input IP3 (Third Order Intercept Point) (IIP3) in the 2.4 GHz band was about −6 dBm at an input frequency of 2.45 GHz. A gain in the 5 GHz band (5 GHz to 6 GHz) was 9.6 to 10.4 dB, and a noise feature (NF) in the 5 GHz band was about 1.3 dB. In addition, input and output return losses in the 5 GHz band were 10 dB or more, and an IIP3 in the 5 GHz band was about −10 dBm at an input frequency of 5.5 GHz. Here, a power supply voltage was 1.8V, and a consumed current was 6.8 mA.

Figure 10:
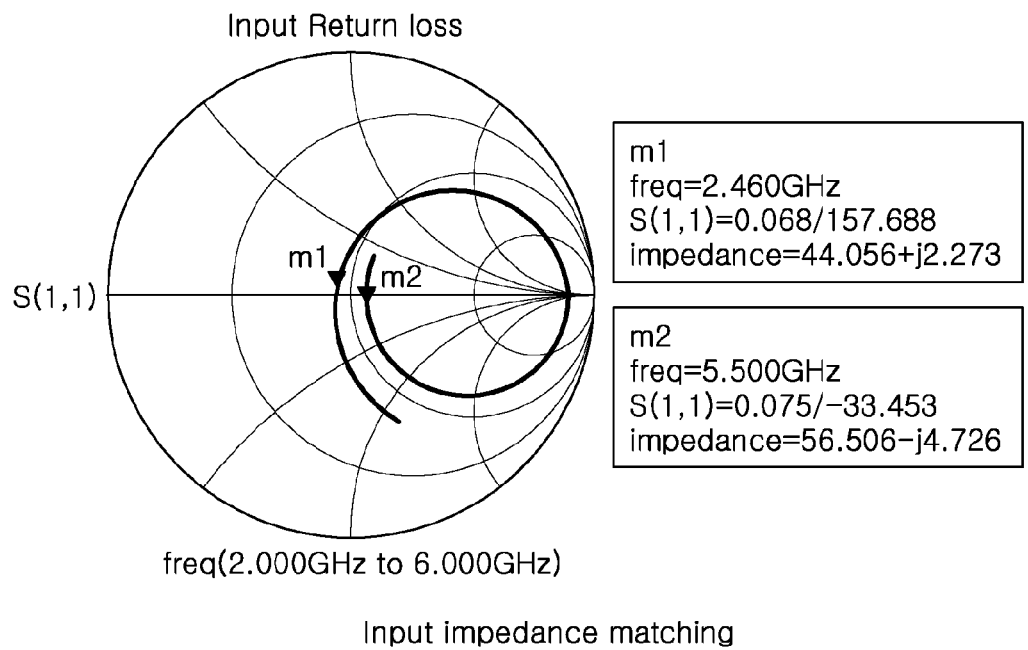
FIG. 10 is a chart for describing input impedance matching according to an exemplary embodiment of the present disclosure.
Figure 11:
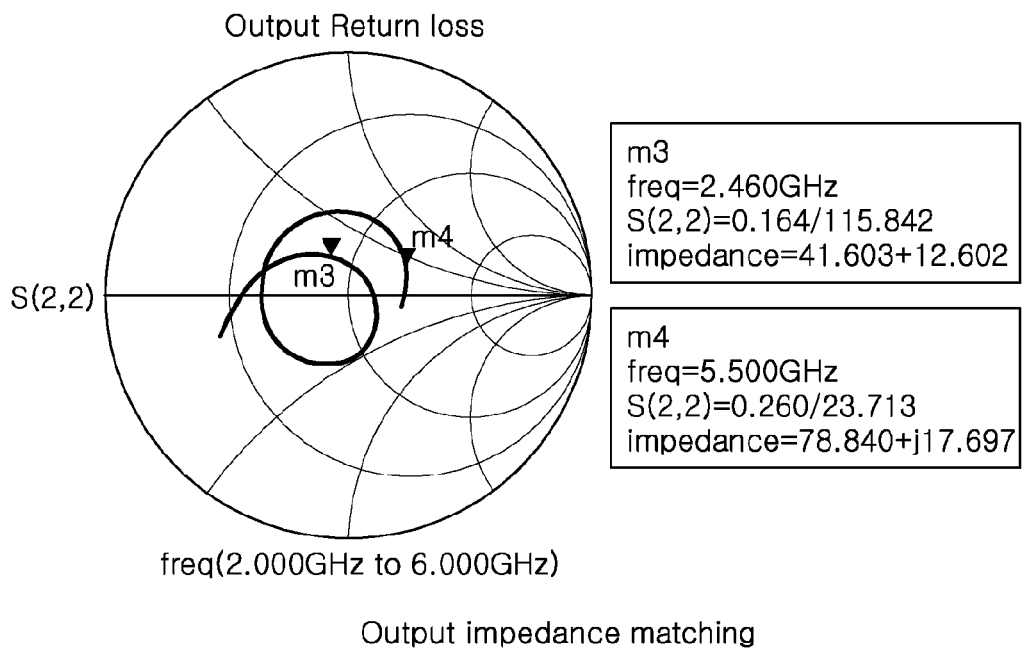
FIG. 11 is a chart for describing output impedance matching according to an exemplary embodiment of the present disclosure.

FIG. 10 is a chart for describing input impedance matching according to an exemplary embodiment of the present disclosure; FIG. 11 is a chart for describing output impedance matching according to an exemplary embodiment of the present disclosure; and FIG. 12 is a chart for describing noise matching according to an exemplary embodiment of the present disclosure.

FIG. 10 shows how well input impedance matching m1 and m2 in each of 2.4 GHz and 5 GHz is performed. Generally, impedance matching may be confirmed by how closely an impedance at a corresponding frequency approaches 50 ohms, and a range in which an impedance is good may be considered to be 40 to 80 ohms. Referring to m1 and m2 of FIG. 10, it may be appreciated that since impedances in 2.4 GHz and 5 GHz are approximately 44.1 ohms and 56.5 ohms, respectively, which are included in the range in which an impedance is good, input impedance matching in each of 2.4 GHz and 5 GHz is performed well.

FIG. 11 shows how well output impedance matching m3 and m4 in each of 2.4 GHz and 5 GHz is performed. Referring to m3 and m4 of FIG. 11, it may be appreciated that since impedances in 2.4 GHz and 5 GHz are approximately 41.6 ohms and 78.8 ohms, respectively, which are included in the range in which an impedance is good, output impedance matching in each of 2.4 GHz and 5 GHz is performed well.

Figure 12:
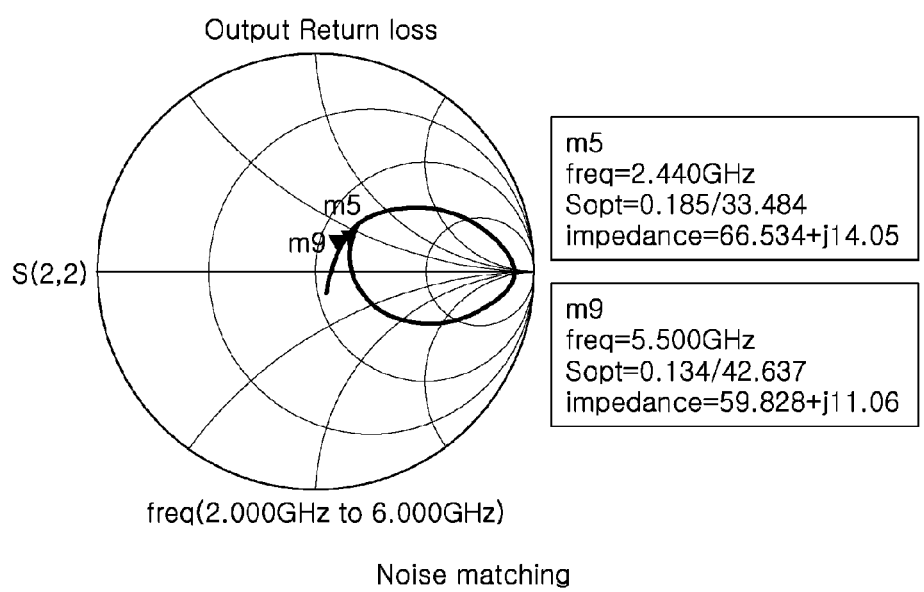
FIG. 12 is a chart for describing noise matching according to an exemplary embodiment of the present disclosure.

In addition, FIG. 12 shows how well noise matching m5 and m9 in each of 2.4 GHz and 5 GHz is performed. Referring to m5 and m9 of FIG. 12, it may be appreciated that since impedances in 2.4 GHz and 5 GHz are approximately 66.5 ohms and 59.8 ohms, respectively, which are included in the range in which an impedance is good, noise matching in each of 2.4 GHz and 5 GHz is performed well.

As set forth above, with the concurrent multi-band radio frequency amplifying circuit according to exemplary embodiments of the present disclosure, at least two bands may be simultaneously processed.

In addition, different circuit units processing at least two bands may share a passive element with each other, such that the concurrent multi-band radio frequency amplifying circuit may be implemented at a compact size.

While exemplary embodiments have been shown and described above, it will be apparent to those skilled in the art that modifications and variations could be made without departing from the spirit and scope of the present disclosure as defined by the appended claims.

What is claimed is:

1. A concurrent multi-band radio frequency (RF) amplifying circuit comprising:
   an input impedance matching unit performing impedance matching on each of first and second band signals included in an input signal input through one input terminal;
   an input amplifying unit including first and second band amplifying units each amplifying the first and second band signals input through the input impedance matching unit;
   a common ground circuit unit connected between a first common node commonly connected to the first and second band amplifying unit and a ground and including an impedance device for matching of an input impedance; and
   an output amplifying unit amplifying signals from each of the first and second band amplifying units,
   wherein the output amplifying unit includes a metal oxide semiconductor (MOS) transistor having a drain and a gate connected to a terminal of a power supply voltage and a source receiving a signal from the input amplifying unit.

2. The concurrent multi-band RF amplifying circuit of claim 1, wherein the input impedance matching unit includes:
   a first impedance device for matching of an input impedance of the first band amplifying unit; and
   a second impedance device for matching of an input impedance of the second band amplifying unit.

3. The concurrent multi-band RF amplifying circuit of claim 1, wherein each of the first and second band amplifying units includes a common source amplifier, and
   the output amplifying unit includes a common gate amplifier.

4. The concurrent multi-band RF amplifying circuit of claim 1, wherein the first band amplifying unit includes an MOS transistor having a drain connected to the output amplifying unit, a gate connected to the input impedance matching unit, and a source connected to the common ground circuit unit.

5. The concurrent multi-band RF amplifying circuit of claim 1, wherein the second band amplifying unit includes an MOS transistor having a drain connected to the output amplifying unit, a gate connected to the input impedance matching unit, and a source connected to the common ground circuit unit.

6. The concurrent multi-band RF amplifying circuit of claim 1, wherein the impedance device of the common ground circuit unit is a common inductor providing an inductance for matching of the input impedance together with the input impedance matching unit.

7. A concurrent multi-band RF amplifying circuit comprising:
   an input impedance matching unit performing impedance matching on each of first and second band signals included in an input signal input through one input terminal;
   an input amplifying unit including first and second band amplifying units each amplifying the first and second band signals input through the input impedance matching unit;
   a common ground circuit unit connected between a first common node commonly connected to the first and second band amplifying unit and a ground and including an impedance device for matching of an input impedance;
   an output amplifying unit connected to each of the first and second band amplifying units in a cascode structure and amplifying signals from each of the first and second band amplifying units; and
   an output impedance matching unit performing matching of an output impedance of the output amplifying unit,
   wherein the output amplifying unit includes a metal oxide semiconductor (MOS) transistor having a drain and a gate connected to a terminal of a power supply voltage and a source receiving a signal from the input amplifying unit.

8. The concurrent multi-band RF amplifying circuit of claim 7, wherein the input impedance matching unit includes:
   a first impedance device for matching of an input impedance of the first band amplifying unit; and
   a second impedance device for matching of an input impedance of the second band amplifying unit.

9. The concurrent multi-band RF amplifying circuit of claim 7, wherein each of the first and second band amplifying units includes a common source amplifier, and
   the output amplifying unit includes a common gate amplifier.

10. The concurrent multi-band RF amplifying circuit of claim 7, wherein the first band amplifying unit includes an MOS transistor having a drain connected to the output amplifying unit, a gate connected to the input impedance matching unit, and a source connected to the common ground circuit unit.

11. The concurrent multi-band RF amplifying circuit of claim 7, wherein the second band amplifying unit includes an MOS transistor having a drain connected to the output amplifying unit, a gate connected to the input impedance matching unit, and a source connected to the common ground circuit unit.

12. The concurrent multi-band RF amplifying circuit of claim 7, wherein the impedance device of the common ground circuit unit is a common inductor providing an inductance for matching of the input impedance together with the input impedance matching unit.

13. A concurrent multi-band RF amplifying circuit comprising:
   an input impedance matching unit performing impedance matching on each of first to N-th band signals included in an input signal input through one input terminal, wherein N is an integer of 2 or more;
   an input amplifying unit including first to N-th band amplifying units each amplifying the first to N-th band signals input through the input impedance matching unit;
   a common ground circuit unit connected between a first common node commonly connected to the first to N-th band amplifying unit and a ground and including an impedance device for matching of an input impedance;
   an output amplifying unit connected to each of the first to N-th band amplifying units in a cascode structure and amplifying signals from each of the first to N-th band amplifying units; and
   an output impedance matching unit performing matching of an output impedance of the output amplifying unit,
   wherein the output amplifying unit includes a metal oxide semiconductor (MOS) transistor having a drain and a gate connected to a terminal of a power supply voltage and a source receiving a signal from the input amplifying unit.

14. The concurrent multi-band RF amplifying circuit of claim 13, wherein the input impedance matching unit includes first to N-th impedance devices for matching of input impedances of each of the first to N-th band amplifying units.

15. The concurrent multi-band RF amplifying circuit of claim 13, wherein each of the first to N-th band amplifying units includes a common source amplifier, and
the output amplifying unit includes a common gate amplifier.

16. The concurrent multi-band RF amplifying circuit of claim 13,
the first band amplifying unit includes an MOS transistor having a drain connected to the output amplifying unit, a gate connected to the input impedance matching unit, and a source connected to the common ground circuit unit, and
the N-th band amplifying unit includes an MOS transistor having a drain connected to the output amplifying unit, a gate connected to the input impedance matching unit, and a source connected to the common ground circuit unit.

17. The concurrent multi-band RF amplifying circuit of claim 13, wherein the impedance device of the common ground circuit unit is a common inductor providing an inductance for matching of the input impedance together with the input impedance matching unit.

18. A concurrent multi-band RF amplifying circuit comprising:
an input impedance matching unit performing impedance matching on each of first to N-th band signals included in an input signal input through one input terminal, wherein N is an integer of 2 or more;
an input amplifying unit including first to N-th band amplifying units each amplifying the first to N-th band signals input through the input impedance matching unit;
a common ground circuit unit connected between a first common node commonly connected to the first to N-th band amplifying unit and a ground and including an impedance device for matching of an input impedance;
an output amplifying unit connected to each of the first to N-th band amplifying units in a cascode structure and amplifying signals from each of the first to N-th band amplifying units; and
an output impedance matching unit performing matching of an output impedance of the output amplifying unit,
wherein the input impedance matching unit includes first to N-th impedance devices for matching of input impedances of each of the first to N-th band amplifying units,
each of the first to N-th band amplifying units includes a common source amplifier and the output amplifying unit includes a common gate amplifier,
the impedance device of the common ground circuit unit is a common inductor providing an inductance for matching of the input impedance together with the input impedance matching unit, and
the output amplifying unit includes a metal oxide semiconductor (MOS) transistor having a drain and a gate connected to a terminal of a power supply voltage and a source receiving a signal from the input amplifying unit.

* * * * *